United States Patent
Liu et al.

(10) Patent No.: US 9,543,181 B2
(45) Date of Patent: Jan. 10, 2017

(54) REPLACEABLE ELECTROSTATIC CHUCK SIDEWALL SHIELD

(75) Inventors: Hsi-Shui Liu, Yangmei (TW); Yeh-Chieh Wang, Hsin-Chu (TW); Jiun-Rong Pai, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 836 days.

(21) Appl. No.: 12/484,934

(22) Filed: Jun. 15, 2009

(65) Prior Publication Data

US 2010/0027188 A1 Feb. 4, 2010

Related U.S. Application Data

(60) Provisional application No. 61/084,865, filed on Jul. 30, 2008.

(51) Int. Cl.
*H01L 21/683* (2006.01)

(52) U.S. Cl.
CPC ................ *H01L 21/6833* (2013.01)

(58) Field of Classification Search
USPC ....................................... 361/234
See application file for complete search history.

(56) References Cited

U.S. PATENT DOCUMENTS

| | | | |
|---|---|---|---|
| 5,191,506 A | 3/1993 | Logan et al. | |
| 5,255,153 A | 10/1993 | Nozawa et al. | |
| 5,583,737 A | 12/1996 | Collins et al. | |
| 5,600,530 A * | 2/1997 | Smith | 361/234 |
| 5,636,098 A * | 6/1997 | Salfelder et al. | 361/234 |
| 5,740,009 A * | 4/1998 | Pu et al. | 361/234 |
| 5,746,928 A | 5/1998 | Yen et al. | |
| 5,835,334 A | 11/1998 | McMillin et al. | |
| 5,886,863 A * | 3/1999 | Nagasaki | H01L 21/6831 279/128 |
| 5,905,626 A * | 5/1999 | Logan et al. | 361/234 |
| 5,986,874 A * | 11/1999 | Ross et al. | 361/234 |
| 6,414,834 B1 | 7/2002 | Weldon et al. | |
| 6,430,020 B1 * | 8/2002 | Atkins et al. | 361/127 |
| 6,557,248 B1 | 5/2003 | Cameron et al. | |
| 7,544,393 B2 * | 6/2009 | Muto | C23C 4/02 118/500 |
| 7,837,828 B2 * | 11/2010 | Ikeda | H01J 37/32431 118/724 |

(Continued)

*Primary Examiner* — Ann Hoang
(74) *Attorney, Agent, or Firm* — Slater Matsil, LLP

(57) ABSTRACT

A replaceable electrostatic chuck sidewall shield is provided. The replaceable electrostatic chuck sidewall shield fills or partially fills an indentation located between a base member and a top member of an electrostatic chuck, such that the replaceable electrostatic chuck sidewall shield may protect an epoxy in the indentation or may replace the epoxy within the indentation. The replaceable electrostatic chuck sidewall shield may be fully contained with the indentation. The replaceable electrostatic chuck sidewall shield may also cover an epoxy in the indentation such that the replaceable electrostatic chuck sidewall shield protrudes beyond the indentation. In an alternate embodiment, the replaceable electrostatic chuck sidewall shield substantially covers the area in which a conductive pole is embedded in a bipolar electrostatic chuck.

21 Claims, 4 Drawing Sheets

(56) References Cited

U.S. PATENT DOCUMENTS

| | | | |
|---|---|---|---|
| 2003/0030960 A1* | 2/2003 | Kanno | H01L 21/67109 361/234 |
| 2004/0027781 A1* | 2/2004 | Hanawa et al. | 361/234 |
| 2004/0134618 A1* | 7/2004 | Endoh et al. | 156/345.51 |
| 2005/0042881 A1* | 2/2005 | Nishimoto et al. | 438/710 |
| 2006/0175772 A1* | 8/2006 | Nozawa | H01L 21/6833 279/128 |
| 2008/0041312 A1* | 2/2008 | Matsuyama et al. | 118/728 |

* cited by examiner

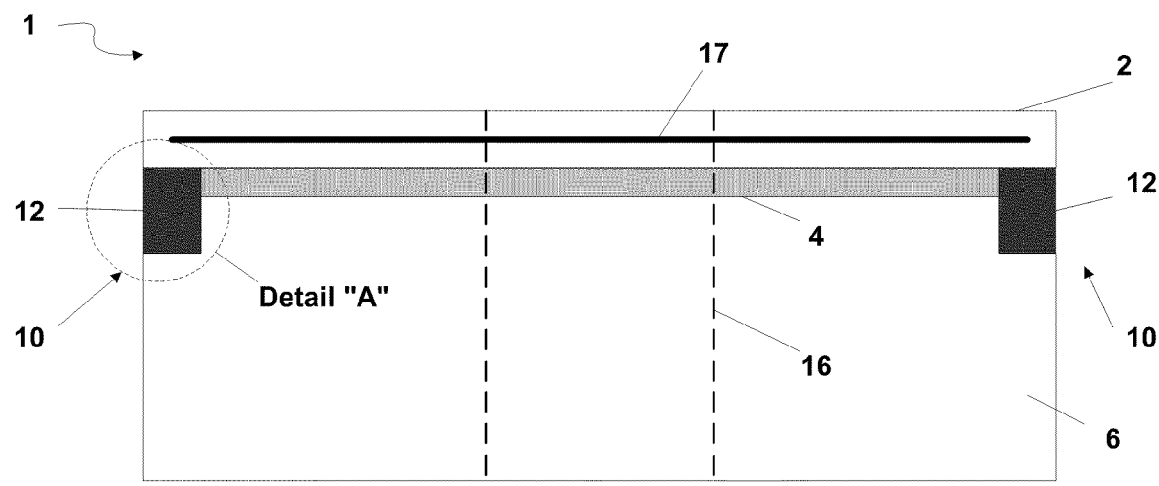
Figure 1A
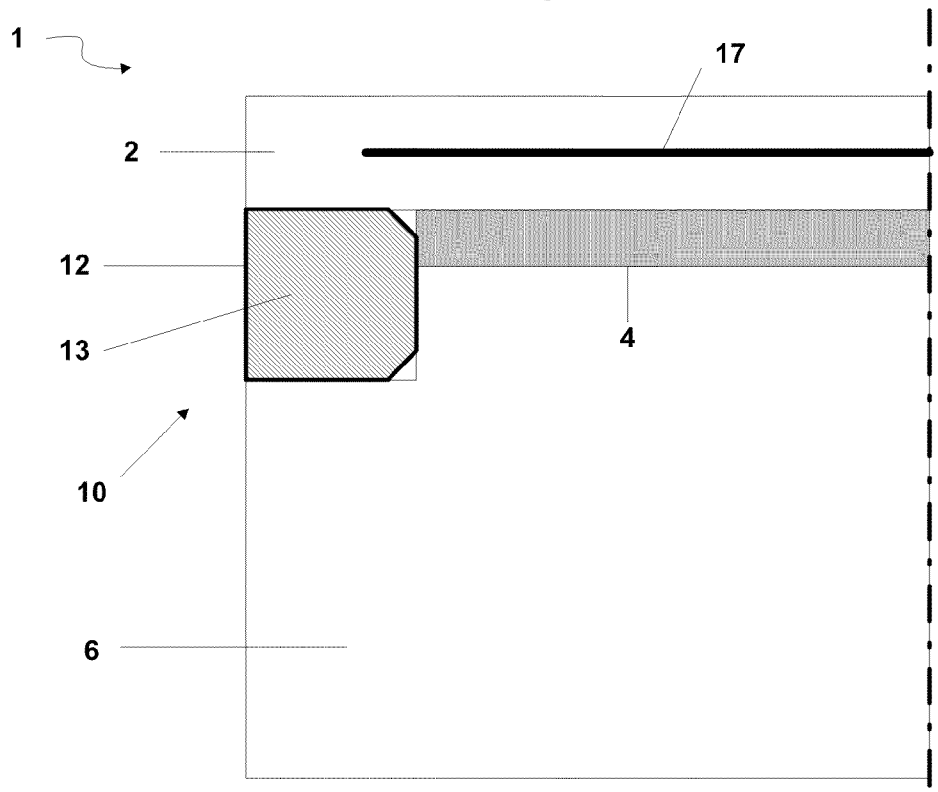
Figure 1B - Detail "A"

REPLACEABLE ELECTROSTATIC CHUCK SIDEWALL SHIELD

This application claims the benefit of U.S. Provisional Application No. 61/084,865, filed on Jul. 30, 2008, entitled "Replaceable Electrostatic Chuck Side-Wall Shield," which application is hereby incorporated herein by reference.

TECHNICAL FIELD

The present invention relates generally to an apparatus for processing integrated circuits and, more particularly, to an apparatus for sealing the sidewall of an electrostatic chuck.

BACKGROUND

In modern integrated circuit semiconductor manufacturing, etching is a process used to pattern circuits on a semiconductor. Plasma etching is one type of etching process, in which a high-speed stream of ions is directed at a wafer. The ions etch the surface of the wafer, thus modifying the wafer's physical topography and allowing the creation of a pattern. Plasma etching apparatuses typically include a plasma chamber and an electrostatic chuck (ESC) residing within the plasma chamber.

The ESC is a device that employs electricity to generate electrostatic forces, such as Coulombic and Johnson-Rahbek Forces, that hold the wafer in place in the plasma chamber while the wafer is processed. ESCs typically include a base member, which acts as an electrode, a top member composed of a dielectric, and some bonding medium between the two layers. Other types of ESCs include a secondary conductive pole insulated from the base member by a dielectric coating that substantially covers the conductive pole and base member. Many modern ESCs use a gas as a heat-conductive material. The gas is supplied through the ESC surface to transfer heat between the wafer and the ESC to control wafer temperature during the etching process.

During the plasma process, the plasma chamber in which the ESC resides fills with plasma and plasma by-products (products of the reaction between the plasma gas and the wafer surface). The plasma and plasma by-products may cause the ESC to deteriorate in a process known as plasma etching or process gas erosion. Another factor that may contribute to the deterioration of ESCs is the installation and removal of process kits. Some process kits surrounding the ESC in the chamber may abrade the ESC sidewall when the kits are installed and removed. Parts abrasion refers to the breaking away of various elements of the ESC, such as the bonding medium between the top member and the base member or the dielectric covering of the base member. The introduction of these particles into the plasma chamber contaminates the plasma chamber and the wafer presently being processed.

Parts abrasion may occur where the top member joins the bottom member and the areas on the side of the ESC that are near components that conduct electricity. As these areas wear down, the heat transfer gas escapes without carrying heat away from the wafer, and electricity arcs between the internal components of the ESC, reducing the holding force of the ESC. Ultimately, the problems of gas leakage and edge arcing shorten the useful life of the ESC.

One attempt to prevent deterioration of ESCs involves the application of epoxy to the ESC in areas prone to parts abrasion. Applying epoxy to these areas slows down ESC deterioration, but the epoxy is not resistant to parts abrasion caused by the plasma or plasma by-products, and as a result, gas leakage and edge arcing may continue to occur. In addition, application of epoxy to the ESC is permanent, making it difficult to refurbish the ESC as the epoxy or other elements of the ESC deteriorate. Therefore, there is a need for an improved electrostatic chuck to overcome the above-described and other shortcomings in the prior art.

SUMMARY OF THE INVENTION

These and other problems are generally solved or circumvented, and technical advantages are generally achieved, by embodiments of the present invention, which provide a replaceable electrostatic chuck sidewall shield.

In an embodiment of the present invention, an electrostatic chuck is provided. The electrostatic chuck has a base member, a top member residing on a top surface of the base member, an indentation located at the interface of the base member and the top member, and a replaceable sidewall shield encircling a periphery of the indentation.

Another embodiment of the present invention provides an electrostatic chuck with a base member, a surface dielectric member over the base member, a conductive pole embedded near a top surface of the surface dielectric member, and a replaceable sidewall shield encircling a periphery of the surface dielectric member and substantially covering a sidewall area in which the conductive pole is embedded in the surface dielectric member.

Yet another embodiment of the present invention provides a plasma apparatus having a chamber, an electrostatic chuck, and a replaceable sidewall shield encircling a periphery of the electrostatic chuck.

An advantage of embodiments of the present invention is that the replaceable sidewall shield is more resistant to damage arising from the conditions within a plasma chamber than prior art methods utilizing epoxy. Additionally, in situations where epoxy is initially applied, the replaceable sidewall shield prevents the epoxy from coming into contact with the plasma gas, and the by-products of the plasma process within the chamber. This results in improved performance and longer life for the electrostatic chuck.

A further advantage of embodiments of the present invention is that a replaceable sidewall shield can be quickly and efficiently replaced, thus allowing for cost-effective rehabilitation of an electrostatic chuck that is otherwise near the limit of its useful life.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of an embodiment of the present invention;

DETAILED DESCRIPTION OF ILLUSTRATIVE EMBODIMENTS

Figure 1C:
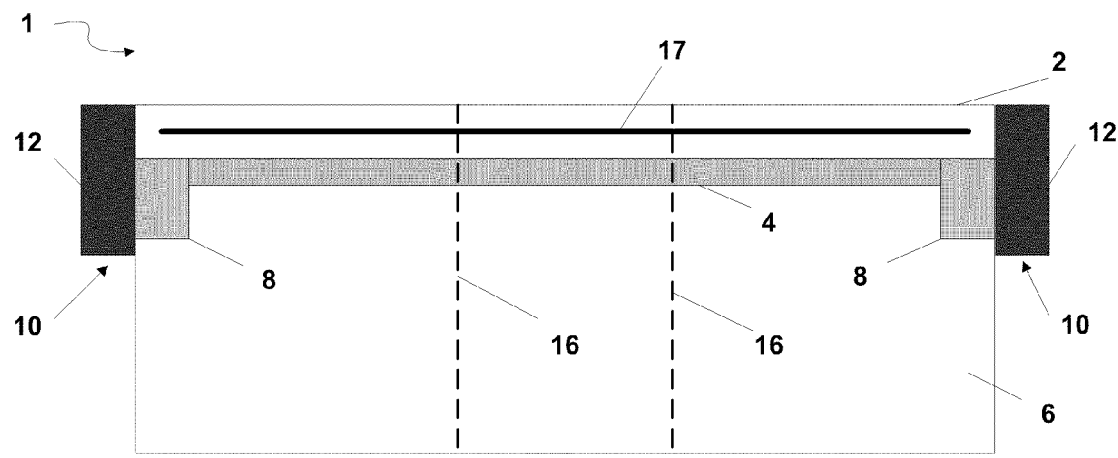

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an electrostatic chuck (ESC) employed in a plasma chamber. The invention may also be applied, however, to other types of chucks and to other types of processing.

Referring now to the drawings, FIGS. 1A-1D illustrate a cross-sectional area of an ESC 1. In the illustrated embodiment shown in FIG. 1A, ESC 1 comprises a top member 2, a bonding layer 4, a base member 6, an indentation 10, a replaceable sidewall shield 12, a gas hole 16, and a conductive pole 17.

Conductive pole 17 comprises a conductive material, such as tungsten, configured to receive a voltage and act as an electrode. Base member 6 receives a heat transfer gas through gas hole 16 to transfer heat from a wafer (not shown) during a plasma process. In the illustrated embodiment, gas hole 16 resides at the center portion of ESC 1 and comprises a hole extending from the top surface of top member 2, through bonding layer 4 and base member 6 where it joins with a gas source (not shown) used to supply gas. In other embodiments, the gas hole may be located elsewhere in the ESC, such as near the outer edge of the ESC instead of at the center as in FIG. 1A. Accordingly, the configuration of gas hole 16 in FIG. 1A is not intended to be limiting, and is shown in its present location and size for simplicity of illustration. The present invention contemplates alternative locations, sizes, and types.

In the embodiment illustrated in FIG. 1A, top member 2 comprises a ceramic dielectric material joined to base member 6 by bonding layer 4. Bonding layer 4 may comprise a silicon glue, although the present invention contemplates additional methods of bonding top member 2 to base member 6. As shown in FIG. 1A, base member 6 has an indentation along the outer periphery near the interface with bonding layer 4, creating indentation 10 between base member 6 and top member 2. Alternatively, as illustrated in FIG. 1D, indentation 10 may be formed in top member 2 along the outer periphery near the interface with bonding layer 4 between base member 6 and top member 2. In other embodiments, the indentation 10 may be positioned in both the base member 6 and the top member 2. It should be noted that in these embodiments, the indentation 10 is preferably along the interface between the top member 2 and the base member 6 such that the exposed surface of the bonding layer 4 is within the indentation 10. The bonding layer may at least partially fill the indentation. As will be discussed in greater detail below, the indentation 10 helps retain the replaceable sidewall shield 12 in place.

As illustrated in FIG. 1A, replaceable sidewall shield 12 is placed into indentation 10, sealing bonding layer 4 from exposure to the plasma environment. Replaceable sidewall shield 12 comprises a material, such as a fluorinated material, that is resistant to plasma gas and the plasma gas by-products created during the plasma process. For example, in poly etcher plasma systems, oxide etcher plasma systems, or chemical vapor deposition (CVD) type processes, replaceable sidewall shield 12 may be formed from a perfluoroelastomer, such as FFKM. In metal etcher plasma systems, replaceable sidewall shield 12 may be formed from a fluorocarbon, such as Viton® manufactured by DuPont®.

In photoresist strip processes, replaceable sidewall shield 12 may be formed from a fluorosilicon, such as FVMQ (a fluorosilicone rubber).

FIG. 1B illustrates Detail "A" of FIG. 1A. As shown in FIG. 1B, replaceable sidewall shield 12 seats into indentation 10, substantially sealing indentation 10 and preventing exposure of bonding layer 4 to the environment of the plasma chamber. Replaceable sidewall shield 12 preferably has cross-sectional geometry 13 conforming to the indentation 10, thereby allowing replaceable sidewall shield 12 to substantially fill indentation 10. For example, in the embodiment illustrated in FIG. 1B, a square or rectangular indentation 10 is substantially filled by replaceable sidewall shield 12. In other embodiments cross-sectional geometry 13 can be substantially circular or any other shape that substantially fills indentation 10 or protects bonding layer 4 from the plasma gas and plasma gas by-products. In some embodiments the replaceable sidewall shield that substantially fills an indentation may protrude outside the indentation.

Preferably, the replaceable sidewall shield 12 is formed of a shape and material such that the elasticity of replaceable sidewall shield 12 secures it in place within indentation 10, thereby preventing slippage. For example, in the illustrated embodiment of FIGS. 1A-1B, replaceable sidewall shield 12 stretches to a size approximately 1.5% larger than its unstretched state. This allows the slightly smaller inner diameter of replaceable sidewall shield to stretch to the diameter of indentation 10 in which replaceable sidewall shield 12 is placed onto ESC 1, substantially filling indentation 10 while reducing the risk of replaceable sidewall shield 12 becoming slack over time.

Figure 1D:
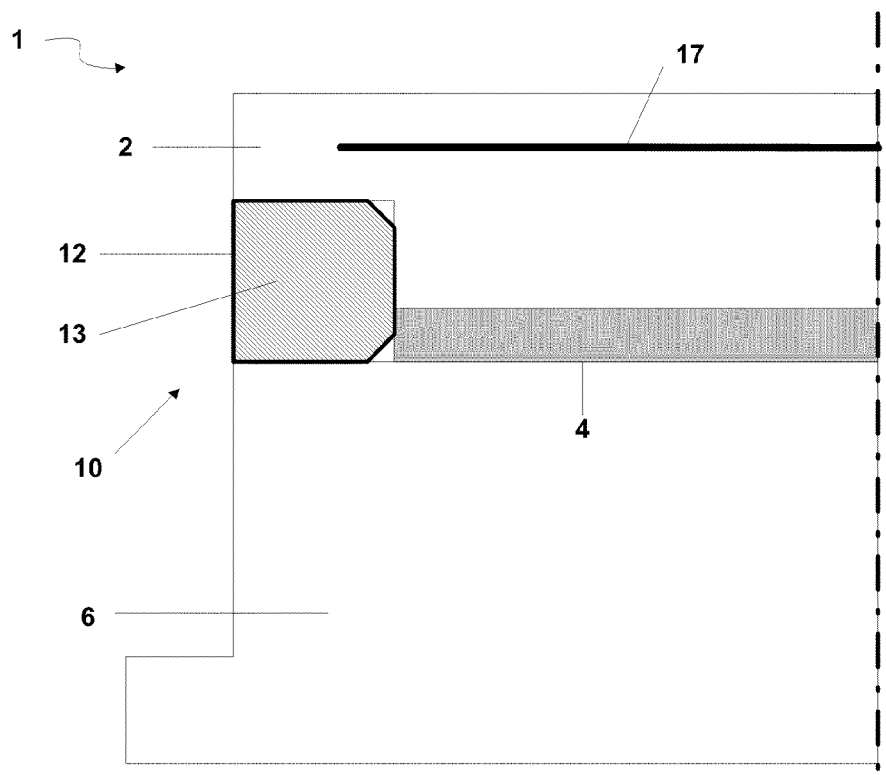

FIG. 1C illustrates an alternative embodiment of the invention. In the illustrated embodiment, epoxy 8 is first placed into indentation 10, creating an additional sealing layer that further prevents exposure of bonding layer 4 to the plasma etching environment. Replaceable sidewall shield 12 is then placed over epoxy 8, substantially covering epoxy 8, providing a second layer of sealing protection.

Sealing indentation 10 with replaceable sidewall shield 12 prevents deterioration of bonding layer 4, substantially slowing down, or stopping parts abrasion. By preventing parts abrasion, embodiments of the invention confine the heat transfer gas supplied through gas hole 16 to the intended pathways, thus reducing or preventing the gas leakage failure mode of ESC 1. This allows ESC 1 to transfer heat away from wafers held during the plasma etching process with little or no decrease in efficiency throughout the useful life of ESC 1. Furthermore, if the plasma processes damage replaceable sidewall shield 12 over time, the use of an elastic replaceable sidewall shield 12 allows its replacement. Unlike an only epoxy filled indentation, replaceable sidewall shield 12 can be easily removed and replaced, greatly extending the life of ESC 1.

Figure 2:
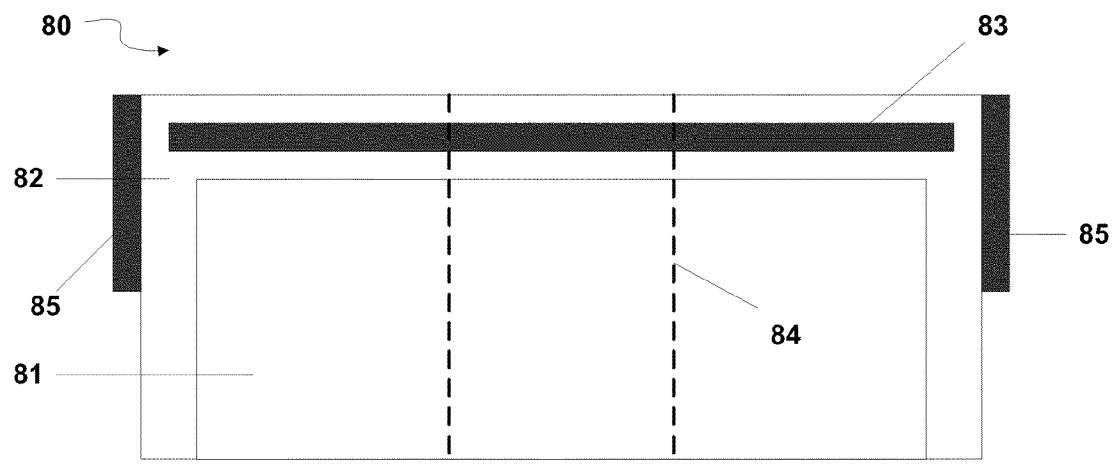
FIG. 2 illustrates a cross-sectional view of an alternative embodiment of the present invention.

FIG. 2 shows yet another alternative embodiment of the present invention. In the illustrated embodiment, an ESC 80 comprises base member 81, surface dielectric member 82, conductive pole 83, and gas hole 84. Base member 81 preferably comprises a conductive element, such as a single piece of aluminum, configured to receive a voltage and act as an electrical pole. Additionally, base member 81 receives a heat transfer gas through gas hole 84 to be used to transfer heat during the plasma process. In the illustrated embodiment, gas hole 84 resides at the center of ESC 80 and comprises a hole extending from the top surface of surface dielectric member 82, through conductive pole 83 and base member 81, where it joins with a gas source (not shown) used to supply gas, which aids in heat transfer during the operation of ESC 80 in the plasma process. The configuration of gas hole 84 is not intended to be limiting, and is shown in its present location and size for simplicity of illustration. The present invention contemplates alternative locations, sizes, and types.

ESC 80 further comprises conductive pole 83 embedded near the top of surface dielectric member 82. Surface dielectric member 82 further comprises a ceramic layer substantially covering conductive pole 83 and base member 81, which electrically insulates conductive pole 83 from base member 81, allowing conductive pole 83 and base member 81 to be biased with opposite polarities. In an illustrative embodiment, the ceramic layer comprises alumina. The opposite biasing of conductive pole 83 and base member 81 creates a potential difference between the top surface of conductive pole 83 and the bottom of a wafer placed on the top surface of surface dielectric member 82, holding the wafer in place on ESC 80.

ESCs of the type illustrated by FIG. 2 suffer from parts abrasion of surface dielectric member 82 in the insulating area separating conductive pole 83 from base member 81. As surface dielectric member 82 wears away due to parts abrasion caused by the plasma and the installation and removal of process kits, conductive pole 83 and base member 81 are exposed allowing electricity to arc between the two elements, which is a phenomenon known as edge arcing. Edge arcing prevents the two poles, base member 81 and conductive pole 83, from maintaining their polarity, thus hindering the ability of ESC 80 to hold a wafer in place during the plasma etching process.

As illustrated in FIG. 2, the present invention overcomes the problem of edge arcing by applying replaceable sidewall shield 85 over the sidewall area in which conductive pole 83 is embedded in surface dielectric member 82. This placement reduces the deterioration caused by the plasma gas and the installation and removal of process kits in the area in which conductive pole 83 is embedded, thus preventing the deterioration of surface dielectric member 82 that leads to edge arcing. Replaceable sidewall shield 85 is similar in composition and geometry to replaceable sidewall shield 12 described above. Replaceable sidewall shield 85 maintains a cross-sectional area that is sufficient to cover the area of principal parts abrasion on the sidewall of ESC 80.

Figures 3A, 3B, 3C:
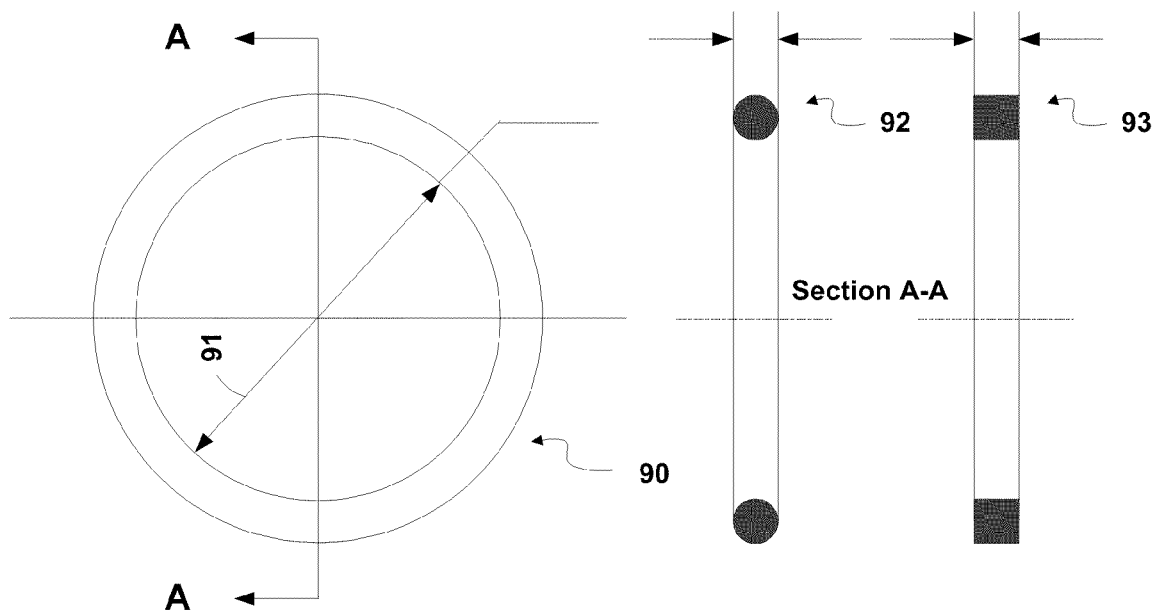
FIGS. 3A-3C illustrate exemplary o-rings employed in embodiments of the present invention.

In the embodiment illustrated in FIG. 3A, replaceable sidewall shield 90 is an o-ring having inner diameter 91. Inner diameter 91 is selected based on the particular ESC upon which replaceable sidewall shield 90 will be placed. As illustrated in FIGS. 3B and 3C, in various embodiments the replaceable sidewall shield 90 can have a cross-sectional geometry 92 of a circular shape, or a cross-sectional geometry 93 of a rectangular shape. The cross-sectional geometry is selected such that replaceable sidewall shield 90 will substantially fill an indentation in an ESC such as in FIG. 1A, or will substantially cover the sidewall of the ESC as in FIG. 2.

Thus, generally, the present invention seals the sidewall of an ESC, allowing improvements over prior art methods of sealing the sidewall of an ESC. For example, unlike prior art methods utilizing epoxy or a ceramic spray coating, the present invention provides a replaceable sidewall shield to seal areas of an ESC that are prone to damage. The replaceable sidewall shield is replaceable as prior replaceable sidewall shields wear out, providing a further advantage over epoxy methods of sealing the sidewall of an ESC, and extending the ESCs life. This provides an additional advantage that a replaceable sidewall shield as posited by this invention is more cost effective than prior art methods of sealing the sidewall of an ESC. It should be appreciated that embodiments of the present invention reduce gas leakage. When a replaceable sidewall shield is applied to the ESC sidewall, the volume (SCCM) of gas necessary to achieve sufficient heat transfer decreases significantly.

Additionally, a reduction in abrasion of the sidewall of an ESC brought about by a sealing replaceable sidewall shield also prevents the deterioration of the insulating ceramic coating between poles of a bipolar or tri-polar ESC. Where the insulating ceramic coating remains intact, the poles of a bipolar or tri-polar ESC do not become exposed, and edge arcing cannot occur.

Figure 4:
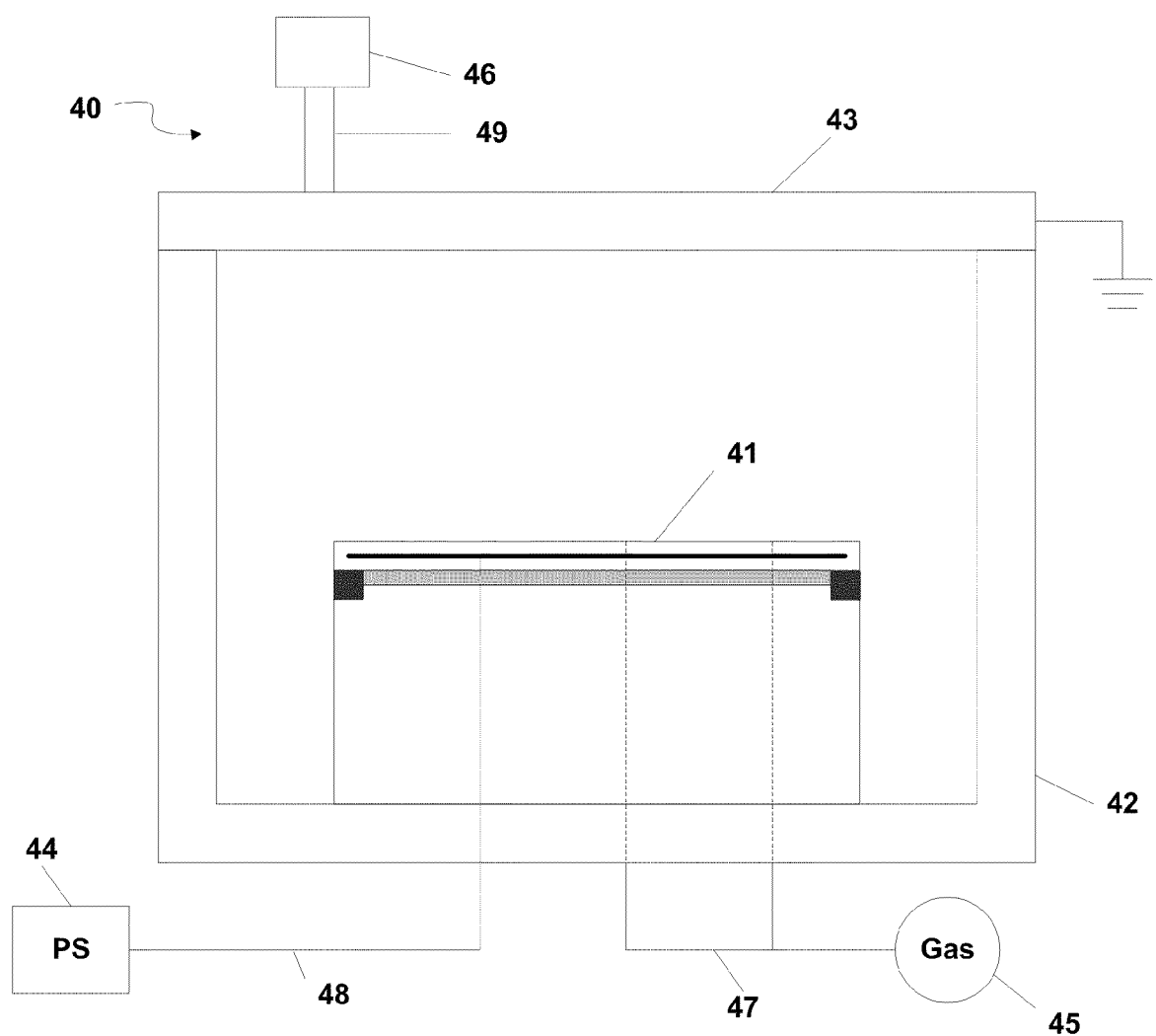
FIG. 4 illustrates a schematic view of an ESC embodiment within a plasma chamber.

Referring now to FIG. 4, there is depicted a plasma process apparatus 40 employing an improved ESC with the replaceable sidewall shield of the present invention. The apparatus has a process chamber made up of an upper casing 43 and a lower casing 42. The upper and lower casings 43 and 42 are made of a conductive material, such as aluminum. An ESC 41 of a type previously described resides within the chamber created by upper casing 43 and lower casing 42. ESC 41 connects to a power source 44 through a path 48. When power source 44 applies a voltage to ESC 41, an electrostatic force is generated between a wafer placed on the top surface of the ESC 41 and the ESC 41, which attracts and holds the wafer on ESC 41.

In order to improve the heat transfer between the wafer and ESC 41, the plasma process apparatus illustrated by FIG. 4 supplies a heat transfer gas between the wafer and ESC 41. The heat transfer gas is supplied by gas source 45 through a line 47 extending through ESC 41. A source of process gas 46 connects to the process chamber through pipe 49. Thus, generally, the above-described apparatus utilizes the improved ESC described above in an improved plasma chamber.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrostatic chuck comprising:
   a base member having a first top surface;
   a top member on the base member;
   an indentation located at an interface of the base member and the top member;
   an adhesive material interposed between the top member and the base member, wherein the adhesive material joins the top member to the base member;
   an epoxy in the indentation, the epoxy contacting the base member and the top member, the epoxy comprising a material different from the adhesive material, the epoxy covering the adhesive material such that the adhesive material is not exposed; and a replaceable sidewall shield encircling a periphery of the indentation, the replaceable sidewall shield covering the epoxy;

wherein a thickness of the adhesive material is less than a thickness of the epoxy in a direction perpendicular to the first top surface, and wherein the thickness of the epoxy is less than a thickness of the replaceable sidewall shield in the direction perpendicular to the first top surface.

2. The electrostatic chuck of claim 1, wherein the replaceable sidewall shield completely covers the indentation.

3. The electrostatic chuck of claim 1, wherein the indentation is in the base member.

4. The electrostatic chuck of claim 1, wherein the indentation is in the top member.

5. The electrostatic chuck of claim 1, wherein the epoxy at least partially fills the indentation.

6. The electrostatic chuck of claim 1, wherein the replaceable sidewall shield encircling the periphery of the indentation comprises an o-ring.

7. The electrostatic chuck of claim 1, wherein the replaceable sidewall shield comprises a fluorinated material.

8. The electrostatic chuck of claim 7, wherein the replaceable sidewall shield comprises one of the group consisting of a perfluoroelastomer, a fluorocarbon, and a fluorosilicon.

9. The electrostatic chuck of claim 1, wherein the replaceable sidewall shield extends along sidewalls of the base member and the top member.

10. A plasma apparatus comprising:
    a chamber;
    an electrostatic chuck positioned within the chamber, the electrostatic chuck comprising a base member attached to a top member by a bonding layer, the bonding layer and the top member having an interface;
    an epoxy contacting the base member and the top member, the epoxy comprising a material different from that of the bonding layer, the epoxy completely covering a periphery of the bonding layer between the base member and the top member; and
    a replaceable sidewall shield encircling a periphery of the electrostatic chuck and covering the epoxy, the replaceable sidewall shield being elastic, an exterior sidewall of the replaceable sidewall shield being exposed to an environment within the chamber, the exterior sidewall of the replaceable sidewall shield and the epoxy being on opposite sides of the replaceable sidewall shield;
    wherein a thickness of the bonding layer is less than a thickness of the epoxy in a direction perpendicular to the interface, and wherein the thickness of the epoxy is less than a thickness of the replaceable sidewall shield in the direction perpendicular to the interface.

11. The plasma apparatus of claim 10, wherein the electrostatic chuck further comprises an indentation located at an interface of the base member and the top member; wherein the replaceable sidewall shield encircles a periphery of the indentation.

12. The plasma apparatus of claim 11, wherein the epoxy is applied within the indentation.

13. The plasma apparatus of claim 10, wherein the electrostatic chuck further comprises:
    a conductive pole embedded near a top surface of the top member, wherein a portion of the top member is interposed between the conductive pole and the base member, and wherein the replaceable sidewall shield substantially covers a sidewall area of the top member where the conductive pole is embedded.

14. The plasma apparatus of claim 10, wherein the replaceable sidewall shield comprises an o-ring.

15. The plasma apparatus of claim 10, wherein the replaceable sidewall shield comprises a fluorinated material.

16. An electrostatic chuck comprising:
    a base member having a first top surface;
    a top member on the base member;
    a bonding layer interposed between the base member and the top member;
    an epoxy contacting the base member and the top member, the epoxy comprising a material different from the bonding layer, the epoxy covering the bonding layer such that the bonding layer is not exposed; and
    a sidewall shield encircling a periphery of the epoxy, the sidewall shield being elastic and covering the epoxy, an exterior sidewall of the sidewall shield being exposed, the exterior sidewall of the sidewall shield and the epoxy being on opposite sides of the sidewall shield;
    wherein a thickness of the bonding layer is less than a thickness of the epoxy in a direction perpendicular to the first top surface, and wherein the thickness of the epoxy is less than a thickness of the sidewall shield in the direction perpendicular to the first top surface.

17. The electrostatic chuck of claim 16, further comprising an indentation located at an interface of the base member and the top member; wherein the sidewall shield encircles a periphery of the indentation.

18. The electrostatic chuck of claim 17, wherein the indentation is located in the base member.

19. The electrostatic chuck of claim 17, wherein the epoxy at least partially fills the indentation.

20. The electrostatic chuck of claim 16, further comprising a conductive pole embedded near a top surface of the top member, wherein a portion of the top member is interposed between the conductive pole and the base member, and wherein the sidewall shield substantially covers a sidewall area of the top member where the conductive pole is embedded.

21. The electrostatic chuck of claim 16, wherein the sidewall shield comprises a fluorinated material.

* * * * *